United States Patent [19]

Kamiyama et al.

[11] Patent Number: 5,202,280
[45] Date of Patent: Apr. 13, 1993

[54] METHOD FOR FABRICATING A SEMICONDUCTOR DEVICE

[75] Inventors: Satoshi Kamiyama; Yuchiro Numasawa, both of Tokyo, Japan

[73] Assignee: NEC Corporation, Tokyo, Japan

[21] Appl. No.: 894,938

[22] Filed: Jun. 8, 1992

[30] Foreign Application Priority Data

Jun. 6, 1991 [JP] Japan .................. 3-134533

[51] Int. Cl.⁵ .................. H01L 21/70
[52] U.S. Cl. .................. 437/47; 437/24; 437/48; 437/52; 437/60; 437/919
[58] Field of Search .................. 437/24, 47, 48, 52, 437/60, 919; 35/23.6, 23.15

[56] References Cited

U.S. PATENT DOCUMENTS

| | | | |
|---|---|---|---|
| 4,876,176 | 10/1989 | Caluiello et al. | 437/919 |
| 5,025,741 | 6/1991 | Suwanai et al. | 437/919 |
| 5,057,447 | 10/1991 | Paterson | 437/919 |

FOREIGN PATENT DOCUMENTS

| | | | |
|---|---|---|---|
| 0134464 | 8/1983 | Japan | 437/919 |
| 0238043 | 9/1989 | Japan | 437/24 |

*Primary Examiner*—Tom Thomas
*Attorney, Agent, or Firm*—Burns, Doane, Swecker & Mathis

[57] ABSTRACT

In a method for fabricating a semiconductor device according to the invention, a tantalum oxide layer is formed on a semiconductor substrate, titanium ions are injected into the tantalum oxide layer, and the tantalum oxide layer is heated to be fined.

9 Claims, 6 Drawing Sheets

METHOD FOR FABRICATING A SEMICONDUCTOR DEVICE

FIELD OF THE INVENTION

This invention relates to a method for fabricating a semiconductor device, and more particularly to, a method for fabricating a capacitive cell used in a VLSI (Very Large Scale Integration) such as a DRAM (Dynamic Random Access Memory) etc.

BACKGROUND OF THE INVENTION

Recently, a capacitive cell used in a VLSI (Very Large Scale Integration) such as a 64MDRAM using a tantalum oxide layer has been proposed to increase a capacitive value per a unit area.

In a conventional method for fabricating a capacitive cell, a tantalum oxide layer is formed on a lower electrode on a semiconductor substrate which is provided with a device separation region and a device formation region. Then, the tantalum oxide layer is processed to be fine in oxygen atmosphere by thermal treatment. After that, an upper electrode is formed on the tantalum oxide layer, so that a capacitive cell is fabricated.

According to the conventional method for fabricating a semiconductor device, however, there is a disadvantage in that a capacitive layer having a predetermined resistance for suppressing a leak current is not obtained, so that a reliability of a semiconductor device thus fabricated is low. That is, when a tantalum oxide layer having a thickness equal to a $SiO_2$ film having a thickness of 30 Å is formed as a capacitive layer, a voltage for a leak current of $10^{-8}$ A/cm$^2$ is as low as 0.6 V. This voltage is defined "a leak-proof voltage" hereinafter. As a result, a semiconductor device having such a capacitive cell is difficult to be put to practical use.

SUMMARY OF THE INVENTION

Accordingly, it is an object of the invention to provide a method for fabricating a semiconductor device by which a tantalum oxide layer of a capacitive layer has a large leak-proof voltage.

According to the feature of the invention, a method for fabricating a semiconductor device includes the steps of:

providing a semiconductor substrate formed with layers and regions for the semiconductor device;

forming a tantalum oxide layer for a capacitive layer on the semiconductor substrate;

injecting titanium ions having a predetermined dose into the tantalum oxide layer with a predetermined injection energy; and heating the tantalum oxide layer to be fine.

BRIEF DESCRIPTION OF THE DRAWINGS

The invention will be explained in more detail in conjunction with appended drawings wherein.

DESCRIPTION OF THE PREFERRED EMBODIMENTS

Before describing a method for fabricating a semiconductor device of the invention, the conventional method described before will be explained in conjunction with FIGS. 1A to 1E.

Figure 1A:
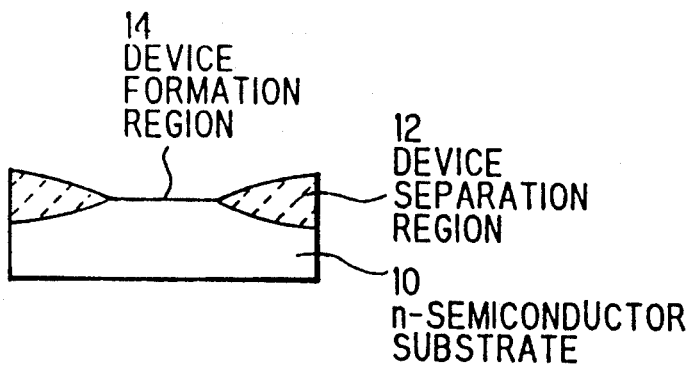
FIGS. 1A to 1E are schematic cross-sectional views showing a conventional method for fabricating a semiconductor device.

First, a device separation region 12 and a device formation region 14 are formed on a n-semiconductor substrate 10 as shown in FIG. 1A.

Figure 1B:
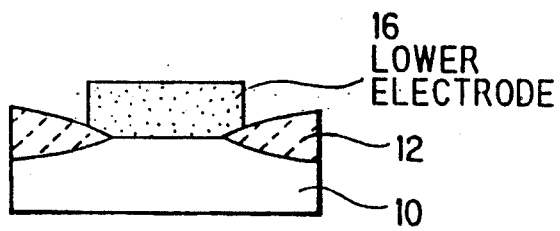

Second, a polysilicon is accumulated on the n-semiconductor substrate 10 by chemical vapor deposition, and is patterned by a lithography/etching technology and phosphorus is doped therein by a thermal diffusion, so that a lower electrode 16 of polysilicon is formed on the device formation region 14 as shown in FIG. 1B.

Figure 1C:
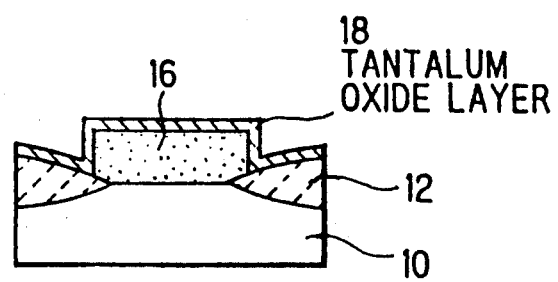

Third, a tantalum oxide layer 18 mainly made of ethoxytantalum is formed on the whole process surface of the substrate 10 by chemical vapor deposition under a reduced pressure as shown in FIG. 1C.

Figure 1D:
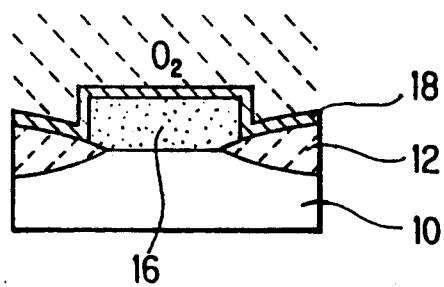

Fourth, the tantalum oxide layer 18 is processed to be fine in oxygen atmosphere by a thermal treatment as shown in FIG. 1D.

Figure 1E:
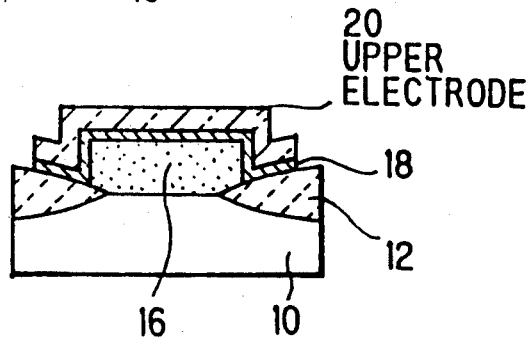

Finally, an upper electrode 20 is formed on the tantalum oxide layer 18, so that a capacitive cell is fabricated as shown in FIG. 1E.

According to the conventional method for fabricating semiconductor device, however, there is a disadvantage in that the tantalum oxide layer has a small leak-proof voltage of 0.6 V against a leak current of $10^{-8}$ A/cm$^2$, so that a reliability of the semiconductor device is low. As a result, the semiconductor device is difficult to be put to practical use.

Next, a method for fabricating a semiconductor device of a first preferred embodiment according to the invention will be explained in conjunction with FIGS. 2A to 2E.

Figure 2A:
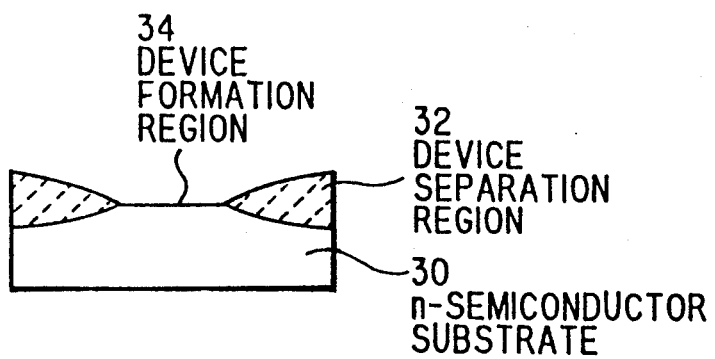
FIGS. 2A to 2E are schematic cross-sectional views showing a method for fabricating a semiconductor device of a first preferred embodiment according to the invention.

First, a device separation region 32 of LOCOS (Local Oxidation Separation) and a device formation region 34 are formed on a n-semiconductor substrate 30 made of single crystal silicon as shown in FIG. 2A.

Figure 2B:
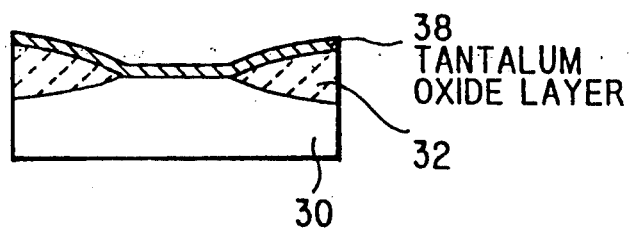

Second, a tantalum oxide layer 38 mainly made of ethoxytantalum is formed on the whole process surface of the substrate 30 by a chemical vapor deposition using a vertical LPCVD apparatus under a reduced pressure shortly after removing a spontaneous oxide layer on the device formation region 34 as shown in FIG. 2B. In more detail, ethoxytantalum of liquid state is vaporized by an $N_2$ bubbling method in a room temperature, and the tantalum oxide layer 38 is grown on condition that a flux of ethoxytantalum gas is 10 sccm, a flux of oxide gas is 10 sccm, a pressure of reactive gas is 0.5 Torr and a deposition temperature is 450° C. Thus, a tantalum oxide layer having a thickness of 50 to 200 Å is obtained by a forming speed of 5 Å/min. In this process, it should be noted that the tantalum oxide layer 38 may be formed on another condition.

Figure 2C:
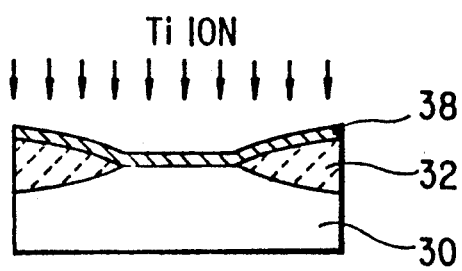

Third, titanium ions having a dose of $10^{15}$ cm$^2$ are injected into the tantalum oxide layer 38 with an injection energy of 10 KeV as shown in FIG. 2C. In this process, titanium ions having a dose of $10^{12}$ cm$^2$ to $10^{16}$ cm² may be used, and an injection energy may have a range of several KeV to hundreds KeV.

Figure 2D:
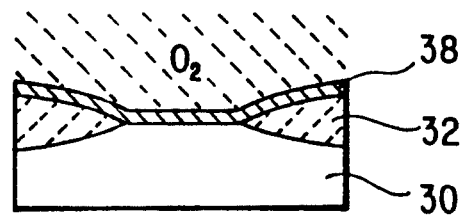

Fourth, the tantalum oxide layer 38 is processed to be fine in oxygen atmosphere, as shown in FIG. 2D, by thermal treatment on condition that a temperature is 600° C. for thirty minutes by using a vertical reactor core. In this process, a temperature of the thermal treatment may be set in a range of 600° to 1000° C. so that a sufficient effect of the invention can be obtained.

Figure 2E:
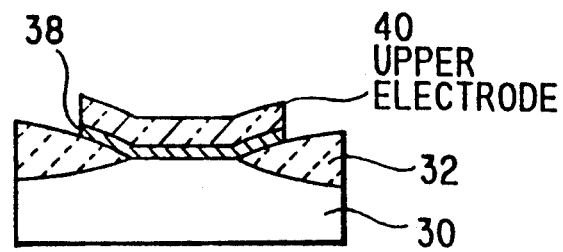

Finally, titanium nitride (TiN) or tungsten (W) is formed on the tantalum oxide layer 38 as an upper electrode 40 by sputtering, and the two layers of the tantalum oxide layer 38 and the upper electrode 40 (TiN/ Ta$_2$ O$_5$ or W/Ta$_2$ O$_5$) are simultaneously patterned by lithography/etching technology, so that a capacitive cell is fabricated as shown in FIG. 2E.

Figure 3:
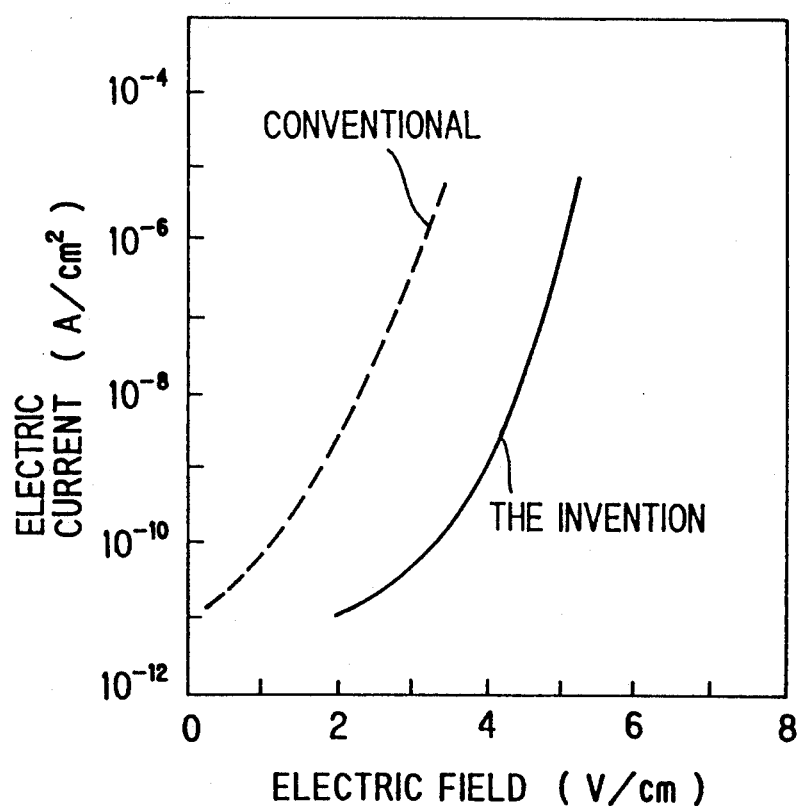
FIG. 3 is a graph showing operation of the first preferred embodiment.

FIG. 3 shows electric current characteristics of tantalum oxide layers. In the graph, a solid line is for the characteristic of the tantalum oxide layer 38 of the first preferred embodiment and a dashed line is for that of the conventional one, respectively. According to the graph, it is verified that the tantalum oxide layer 38 of the first preferred embodiment has a high leak-proof voltage. It can be considered that this effect is obtained for the following reasons, that is, a dangling bond in the tantalum oxide layer 38 is reinforced by Ti-O bonding, and an occurrence of crystallizing the tantalum oxide layer 38 by a thermal treatment is avoided.

As described above, according to the first preferred embodiment, the capacitive cell can be used for a VLSI (Very Large Scale Integration) such as not only a 64MDRAM but also for a 256M-1GDRAM, because the tantalum oxide layer 38 has a high leak-proof voltage characteristic.

Next, a method for fabricating a semiconductor device in which a tantalum oxide layer is formed on a polysilicon electrode in a second preferred embodiment according to the invention will be explained in conjunction with FIGS. 4A to 4G.

Figure 4A:
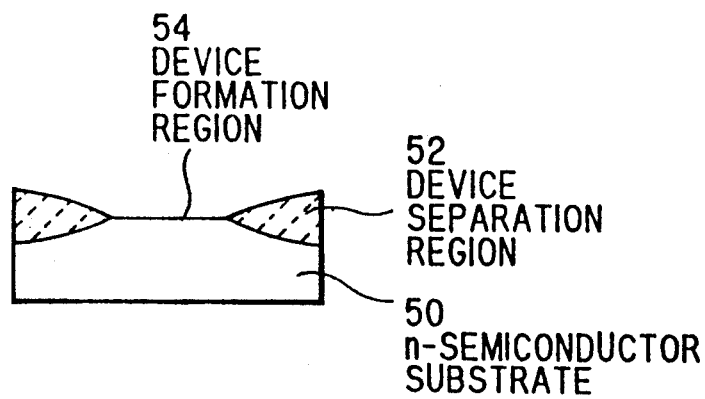
FIGS. 4A to 4G are schematic cross-sectional views showing a method for fabricating a semiconductor device of a second preferred embodiment according to the invention.

First, a device separation region 52 of LOCOS (Local Oxidation Separation) and a device formation region 54 are formed on a n-semiconductor substrate 50 made of single crystal silicon as shown in FIG. 4A.

Figure 4B:
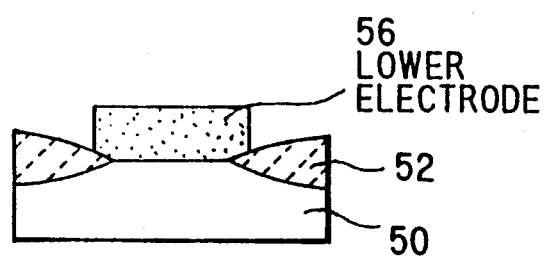

Second, a polysilicon is accumulated on the n-semiconductor substrate 50 by chemical vapor deposition, and is patterned by lithography/etching technology and phosphorus is doped therein by thermal diffusion, so that a lower electrode 56 of polysilicon is formed on the device formation region 54 as shown in FIG. 4B.

Figure 4C:
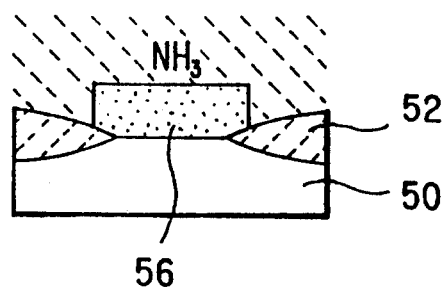

Third, the surface of the lower electrode 56 is nitrified by using ammonia gas (NH$_3$) shortly after removing a spontaneous oxide layer on the lower electrode 56 as shown in FIG. 4C. This process is carried out by using a thermal treatment apparatus having a load-lock mechanism, on condition that a back pressure is $10^{-2}$ in a degree of vacuum, an ammonia gas density is 99.999%, a treatment temperature is 800° C. and a treatment time is thirty minutes.

Figure 4D:
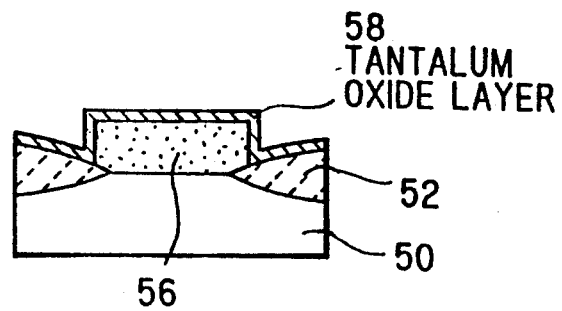

Fourth, a tantalum oxide layer 58 is formed on the whole process surface of the substrate by chemical vapor deposition under a reduced pressure as shown in FIG. 4D in the same manner as the first preferred embodiment.

Figure 4E:
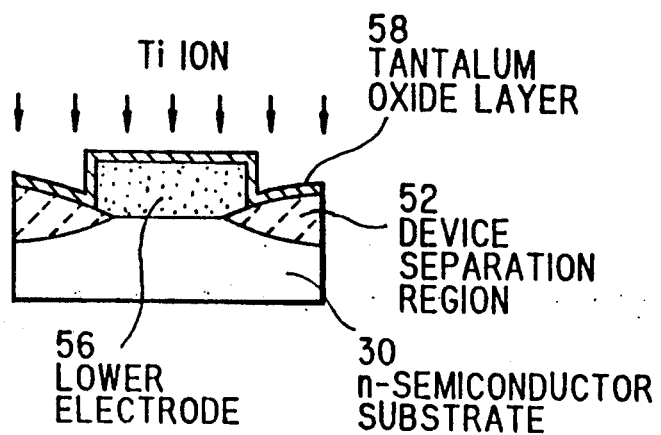

Fifth, titanium ions having a dose of 10$^{15}$ cm² are injected into the tantalum oxide layer 58 with an injection energy of 10KeV as shown in FIG. 4E.

Figure 4F:
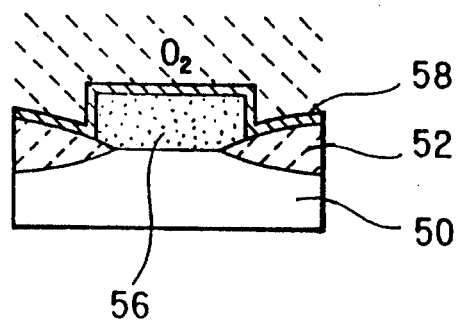

Sixth, the tantalum oxide layer 58 is processed to be fine in oxygen atmosphere as shown in FIG. 4F in the same manner as the first preferred embodiment.

Figure 4G:
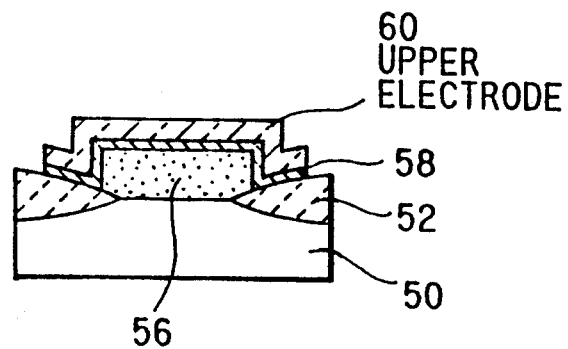

Finally, titanium nitride (TiN) or tungsten (W) is formed on the tantalum oxide layer 58 as an upper electrode 60 by sputtering, and the two layers of the tantalum oxide layer 58 and the upper electrode of the tantalum oxide layer 58 and the upper electrode 60 (TiN/ Ta$_2$ O$_5$ or W/ Ta$_2$ O$_5$) are simultaneously patterned by lithography/etching technology, so that a capacitive cell is fabricated as shown in FIG. 4G.

In the same manner as the first preferred embodiment, the tantalum oxide layer 58 has a high leak-proof voltage.

Figure 5:
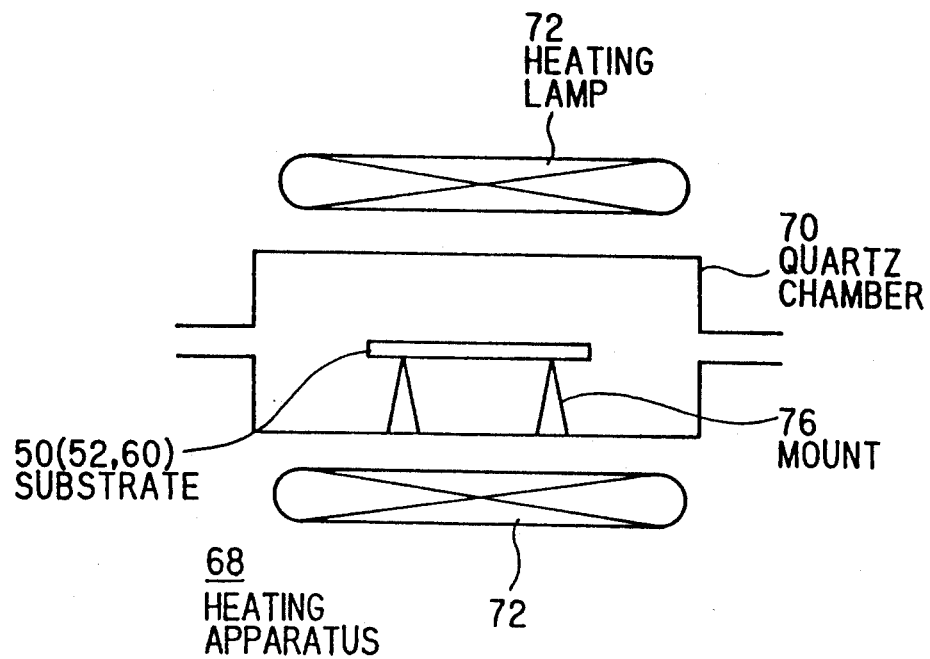
FIG. 5 is a schematic view showing a heating apparatus used for a third preferred embodiment according to the invention.

FIG. 5 shows a heating apparatus 68 used in a third preferred embodiment for nitrifying a polysilicon electrode. The heating apparatus 68 includes a quartz chamber 70, heating lamp 72 positioned around the quartz chamber 70, and a mount 76 supporting a substrate 50 in the quartz chamber 72.

The thermal treatment by the heating apparatus 68 is carried out on condition that a NH$_3$ gas density is 99.9999%, a treatment temperature is 900° C. and a treatment time is twenty seconds. In this treatment, a treatment temperature is necessary to be more than 600° C. According to the third preferred embodiment, a nitrifying process can be carried out in a short time because of using the heating apparatus 68.

Although the invention has been described with respect to specific embodiments for complete and clear disclosure, the appended claims are not thus limited and alternative constructions may occur to one skilled in the art which fairly fall within the basic teaching herein set forth.

What is claimed is:

1. A method for fabricating a semiconductor device, comprising the steps of:
   providing a semiconductor substrate formed with layers and regions for said semiconductor device;
   forming a tantalum oxide layer for a capacitive layer on said semiconductor substrate;
   injecting titanium ions having a predetermined dose into said tantalum oxide layer with a predetermined injection energy; and
   heating said tantalum oxide layer to be fine.

2. A method for fabricating a semiconductor device according to claim 1, wherein:
   said step of forming a tantalum oxide layer is carried out by chemical vapor deposition using organic tantalum as a main material.

3. A method for fabricating a semiconductor device according to claim 1, wherein:
   said step of injecting titanium ions is carried out by using titanium ions having dose of 10$^{12}$ to 10$^{16}$ cm².

4. A method for fabricating a semiconductor device according to claim 1, wherein:
   said step of heating a tantalum oxide layer is carried out in an oxygen atmosphere.

5. A method for fabricating a semiconductor device according to claim 1, wherein:
   said step of heating a tantalum oxide layer is carried out at a temperature of 600° to 1000° C.

6. A method for fabricating a semiconductor device, comprising the steps of:
   providing a semiconductor substrate formed with layers and regions for said semiconductor device;
   providing a lower electrode of polysilicon on a semiconductor substrate;

nitrifying a surface of said lower electrode;
forming a tantalum oxide layer for a capacitive layer on said nitrified lower electrode;
injecting titanium ions into said tantalum oxide layer;
heating said tantalum oxide layer to be fine; and
providing an upper electrode on said tantalum oxide layer.

7. A method for fabricating a semiconductor device, according to claim 6, further comprising the step of;
doping phosphorus in said lower electrode before said step of nitrifying.

8. A method for fabricating a semiconductor device, according to claim 6, wherein:
said step of nitrifying a lower electrode is carried out by using a lamp heater.

9. A method for fabricating a semiconductor device, according to claim 6, wherein:
said step of providing an upper electrode is carried out by sputtering or chemical vapor deposition using a single layer of titanium nitride, tungsten or molybdenum, or a combination layer of titanium nitride and tungsten or titanium nitride and molybdenum.

* * * * *